(12) United States Patent
Kerner

(10) Patent No.: US 6,307,411 B1
(45) Date of Patent: Oct. 23, 2001

(54) WIDE TRACKING RANGE, AUTO RANGING, LOW JITTER PHASE LOCK LOOP FOR SWEPT AND FIXED FREQUENCY SYSTEMS

(75) Inventor: Thomas M. Kerner, Manorville, NY (US)

(73) Assignee: Brookhaven Science Associates, Upton, NY (US)

( * ) Notice: Subject to any disclaimer, the term of this patent is extended or adjusted under 35 U.S.C. 154(b) by 0 days.

(21) Appl. No.: 09/689,976

(22) Filed: Oct. 13, 2000

(51) Int. Cl.[7] .......................................................... H03L 7/06
(52) U.S. Cl. ............................................ 327/156; 375/376
(58) Field of Search ............................ 327/156, 159, 327/162, 163, 165; 331/1, 11, 17, 25; 375/359, 371, 373, 376

(56) References Cited

U.S. PATENT DOCUMENTS

| | | | |
|---|---|---|---|
| 3,983,498 | 9/1976 | Malek | 328/155 |
| 4,031,549 | * 6/1977 | Rast et al. | 331/DIG. 2 |
| 4,321,706 | * 3/1982 | Craft | 375/59 |
| 4,847,875 | 7/1989 | Choi | 375/112 |
| 4,972,160 | 11/1990 | Sylvain | 331/1 A |
| 5,027,085 | 6/1991 | DeVito | 331/1 A |
| 5,036,294 | 7/1991 | McCaslin | 331/1 A |
| 5,077,529 | 12/1991 | Ghoshal et al. | 328/155 |
| 5,128,625 | 7/1992 | Yatsuzuka et al. | 328/155 |
| 5,159,291 | 10/1992 | Ghoshal | 331/1 A |
| 5,241,285 | 8/1993 | Jackson | 331/1 A |
| 5,278,874 | * 1/1994 | Liu et al. | 331/11 |
| 5,373,255 | 12/1994 | Bray et al. | 331/1 A |
| 5,396,492 | 3/1995 | Lien | 370/60 |
| 5,469,478 | 11/1995 | Lee | 375/376 |
| 5,546,434 | 8/1996 | Kalafatis | 375/376 |
| 5,563,921 | 10/1996 | Mesuda et al. | 375/376 |
| 5,654,987 | 8/1997 | Nakamura | 375/355 |
| 5,699,387 | 12/1997 | Seto et al. | 375/376 |
| 5,727,037 | 3/1998 | Maneatis | 375/376 |
| 5,737,373 | 4/1998 | Sato et al. | 375/376 |
| 5,809,097 | 9/1998 | Lakshmikumar | 375/376 |
| 5,939,912 | * 8/1999 | Rehm | 327/158 |
| 5,982,821 | * 11/1999 | Kingston et al. | 375/326 |
| 5,987,085 | 11/1999 | Anderson | 375/374 |
| 6,044,124 | 3/2000 | Monahan et al. | 375/376 |

OTHER PUBLICATIONS

Kerner, et al., "V123 Beam Synchronous Encoder Module", 1999 Particle Accelerator Conference (PAC), New York, New York, May 1999.

* cited by examiner

Primary Examiner—Kenneth B. Wells
Assistant Examiner—Linh Nguyen
(74) Attorney, Agent, or Firm—Margaret C. Bogosian

(57) ABSTRACT

The present invention provides a wide tracking range phase locked loop (PLL) circuit that achieves minimal jitter in a recovered clock signal, regardless of the source of the jitter (i.e. whether it is in the source or the transmission media). The present invention PLL has automatic harmonic lockout detection circuitry via a novel lock and seek control logic in electrical communication with a programmable frequency discriminator and a code balance detector. (The frequency discriminator enables preset of a frequency window of upper and lower frequency limits to derive a programmable range within which signal acquisition is effected. The discriminator works in combination with the code balance detector circuit to minimize the sensitivity of the PLL circuit to random data in the data stream). In addition, the combination of a differential loop integrator with the lock and seek control logic obviates a code preamble and guarantees signal acquisition without harmonic lockup. An adaptive cable equalizer is desirably used in combination with the present invention PLL to recover encoded transmissions containing a clock and/or data. The equalizer automatically adapts to equalize short haul cable lengths of coaxial and twisted pair cables or wires and provides superior jitter performance itself. The combination of the equalizer with the present invention PLL is desirable in that such combination permits the use of short haul wires without significant jitter.

47 Claims, 5 Drawing Sheets

WIDE TRACKING RANGE, AUTO RANGING, LOW JITTER PHASE LOCK LOOP FOR SWEPT AND FIXED FREQUENCY SYSTEMS

This invention was made with Government support under contract number DE-AC02-98CH10886, awarded by the U.S. Department of Energy. The Government has certain rights in the invention.

FIELD OF THE INVENTION

The present invention is directed to an apparatus and method for a wide tracking range phase lock loop ("PLL") with exceptionally low jitter. In particular, the present invention relates to PLL applications that require low phase noise or zero crossing jitter for encoded transmissions. A PLL of the present invention separates the clock from the encoded data such that the recovered clock and data are both reduced significantly in jitter. This is very helpful in accurate position control applications that require precise phase, spatial or time measurement or control.

BACKGROUND OF THE INVENTION

It is often necessary in communication, digital audio and similar applications to lock to an external clock or reference while generating a new clock source that is immune to various sources of phase and frequency noise in the incoming reference signal. In order for a receiver to receive and capture data, as referenced to a transmitter's clock signal, it is necessary for the receiver to have a clock signal that is synchronized or phase aligned to the same clock signal.

Phase locked loop (PLL) circuits have been commonly used for the purpose of generating a signal in a preferred phase relationship relative to another signal. A PLL carefully adjusts to its own clock (the "local oscillator") to bring it into precise alignment with some external signal (the "reference clock"). In serial data communications and similar applications, the reference clock is often embedded in a stream of data bits. It is the PLL's task in a clock recovery subsystem to align its local oscillator with the reference clock information embedded in the data stream. The PLL circuit within the receiver can adjust its local clock signal frequency to a multiple of the reference signal frequency, thereby phase aligning the two signals together. The phase relationship between the reference signal and the local clock signal is then referred to as being locked. Once properly aligned, the local oscillator can be used to clock bits out of the data stream, sampling each data baud right in the center at the point of maximum noise immunity.

As illustrated in FIG. 1, a conventional PLL 10 provides a feedback system combining a voltage-controlled oscillator (VCO) 12 and a phase comparator or detector 14 in electronic communication therewith such that the oscillator frequency or phase accurately tracks that of an applied frequency or phase-modulated signal, respectively. In a PLL, the error signal from the phase comparator is the difference between the input frequency or phase and that of the signal fed back. If $f_{in}$ does not equal $f_{VCO}$, phase comparator 14 generates a phase error output signal that is a measure of the phase difference. The phase error signal, after being filtered by loop filter 16 and amplified by amplifier 18, causes $f_{VCO}$ to deviate in the direction of $f_{in}$. The VCO will eventually "lock" to $f_{in}$ so as to maintain a fixed relationship with the input signal.

In this application, any imperfections in a transmit clock that is used to construct a data stream may compromise the ability of the PLL to properly align its local oscillator. Imperfections in the transmit clock are sometimes classified as frequency offsets, wander or, as used herein, "jitter". Jitter, a common problem associated with PLL circuits, can be defined as abrupt, spurious variations in the phase of successive pulses as referenced to the phase of a continuous oscillator, causing deleterious variations in the output frequency. As the jitter frequency on the input signal increases, the bandwidth requirements of the PLL likewise increase. The precision of the recovered clock, therefore, is a limitation on system performance.

With the introduction of more sophisticated services involving the transfer of large amounts of information such as digital data, video or voice data, communication networks must provide predictably superior levels of performance while ensuring the maintenance of data quality. In a digital communication system, for instance, one application of a PLL may be to provide a "clean" clock signal which has the same frequency and phase as a received digital data signal that is to be decoded. A typical digital PLL design uses a reference clock having a frequency that is much higher than that of an incoming data signal to generate the output clock. This approach, however, can only guarantee a phase lock that is within one clock period of the reference clock. This error in the phase lock constitutes jitter. In analog conventional PLL circuits jitter is commonly caused by the errors in the filtering of the control voltage and VCO noise.

Once jitter contaminates a signal, it propagates through a system, often increasing as it passes through various devices. PLLs have therefore traditionally found limited use in those systems requiring very high stability. Systems incorporating radar oscillators, for example, require very high stability that can only be provided by narrowing the loop bandwidth. This in turn degrades the frequency tracking performance of the PLL and detracts from an inherently desirable feature of PLL oscillators. When the loop gain of the PLL is high, the pull-in and lock-in times are short, yet the sensitivity to noise (both internal and external) becomes high, resulting in large phase jitter and frequency jitter in the output. On the other hand, when the loop gain of the PLL is low and the bandwidth is narrow so as to remove noise, the pull-in and lock-in capabilities for the frequency offset and the initial phase difference become low, resulting in narrower pull-in and lock-in ranges. The narrow bandwidth of the loop not only takes a long time to achieve the lock-in state for a large frequency offset but also presents difficulty in holding the lock-in state for a frequency shift. It therefore becomes difficult for the loop to lock, and track and carrier loss is realized.

It is therefore desirable to construct a low jitter PLL that has a relatively large bandwidth by controlling harmonics that creep in at higher bandwidths. Good harmonic suppression is important in PLLs because this affects loop characteristics (i.e., stability, phase error, jitter). Although not readily apparent, harmonics with balanced codes exist off of the fundamental that can cause false locks with pseudo-random code streams. A PLL that exhibits optimum harmonic suppression is therefore not only beneficial in reducing jitter on the transmit side, but it is also instrumental in rejecting noise and transmission-media-induced distortions on both of the reception and instrumentation sides.

SUMMARY OF THE INVENTION

The present invention provides a wide tracking range phase locked loop (PLL) circuit that achieves minimal jitter in a recovered clock signal. The PLL of the present invention is particularly adapted for applications that require excellent stability (i.e., low phase noise and/or low phase drift). The PLL of the present invention is further applicable for encoded transmissions containing clock and/or data such that the recovery of such clock and/or data is effected without the need for signal acquisition preambles, while avoiding harmonic locks in fixed and/or swept frequency systems.

The PLL circuitry disclosed herein provides a means to produce a low jitter recovered clock regardless of the source of the jitter (i.e. whether it is in the source or the transmission media) and has automatic harmonic lockout detection circuitry through means of a novel lock and seek control logic in electrical communication with a programmable frequency discriminator and a code balance detector. The frequency discriminator enables preset of a frequency window of upper and lower frequency limits to derive a programmable range within which signal acquisition is effected. The discriminator works in combination with the code balance detector circuit to minimize the potential for false lock. Useable frequency sweeps may thereby extend through several frequency harmonics while avoiding such harmonics during signal acquisition. This allows a large frequency swept range without a preamble to be used while avoiding harmonic lockup during acquisition.

In addition, the combination of a differential loop integrator with the lock and seek control logic guarantees swift signal acquisition with a clean noise output signal without harmonic lockup. This combination allows a larger dynamic range by programmable means as compared to other design topologies, thereby allowing greater flexibility, and large swept frequency ranges.

An adaptive cable equalizer is desirably used in combination with the present invention PLL to recover encoded transmissions containing a clock and/or data. The adaptive cable equalizer is a low-cost monolithic solution for equalizing data transmitted over cable or any other media having similar dispersive loss characteristics. The equalizer automatically adapts to equalize short haul cable lengths of coaxial and twisted pair cables or wires and provides superior jitter performance itself. The combination of the equalizer with the present invention PLL is desirable in that such combination permits the use of short haul wires with the added advantage of significantly reduced source jitter.

Using the PLL circuit of the present invention, no signal acquisition preambles are required to avoid harmonic locks in fixed, intermittent and/or swept frequency systems. This PLL will automatically seek and lock onto fixed and/or varying frequency encoded input signals and reject harmonics of the encoded signal stream. The disclosed technique further permits large frequency sweeps through harmonics without the potential for harmonic lockup on signal acquisition. Digital input data is re-clocked by a low jitter recovery clock and demodulated. The output-recovered clock desirably has a 50% duty factor. The described technique will work for any DC balanced code modulation scheme used in most high capacity digital transmission and storage devices.

It is important that the implementation of the present invention PLL generates the least possible switching noise. It is further important that optimum analog and digital noise isolation and shielding are achieved through precise PWB design using isolated solid power planes for both analog and digital circuitry.

It is therefore an advantage of the present invention to provide a PLL that is highly immune to input signal jitter.

It is another advantage of the present invention to provide a PLL that recovers the accuracy of the original clock in a noise transmission environment with the least possible jitter.

It is an additional advantage of the present invention to provide such a low jitter PLL that achieves wide range tracking with low phase error and drift for data and clock recovery.

It is yet another additional advantage of the present invention to provide a low jitter PLL in a compact and inexpensive design that uses commercially available technology.

It is still another advantage of the present invention to implement a low jitter PLL for both fixed and swept frequency systems.

It a further advantage of the present invention to provide a PLL having an output that maintains a constant phase relationship with its input, even over a large range of input frequencies. The PLL, having one reference clock input and multiple buffered clock outputs, continuously monitors the relation between the phase of the input reference clock and the phase of the outputs. The PLL then adjusts the output transitions so that they land precisely on top of the input transitions within a tight timing window.

DETAILED DESCRIPTION OF THE PREFERRED EMBODIMENTS

The present invention provides for a phase lock loop (PLL) that recovers a reference clock and reduces jitter from a serial data stream that is transmitted thereto. The low jitter PLL output clock is used to clock counters for accurate delays and then buffered for further distribution. Sub-nanosecond jitter is achieved with the combination of an adaptive cable equalizer at the PLL input and the use of a digital frequency discriminator that avoids harmonic lock-up on signal acquisition. Implementing a differential loop integrator further attenuates jitter. The integrator that is holding the last lock-on voltage then only has to slew over a narrow range to track. This limits the control voltage swing and hence the probability of crossing over and finding a nearby harmonic.

Figure 1:
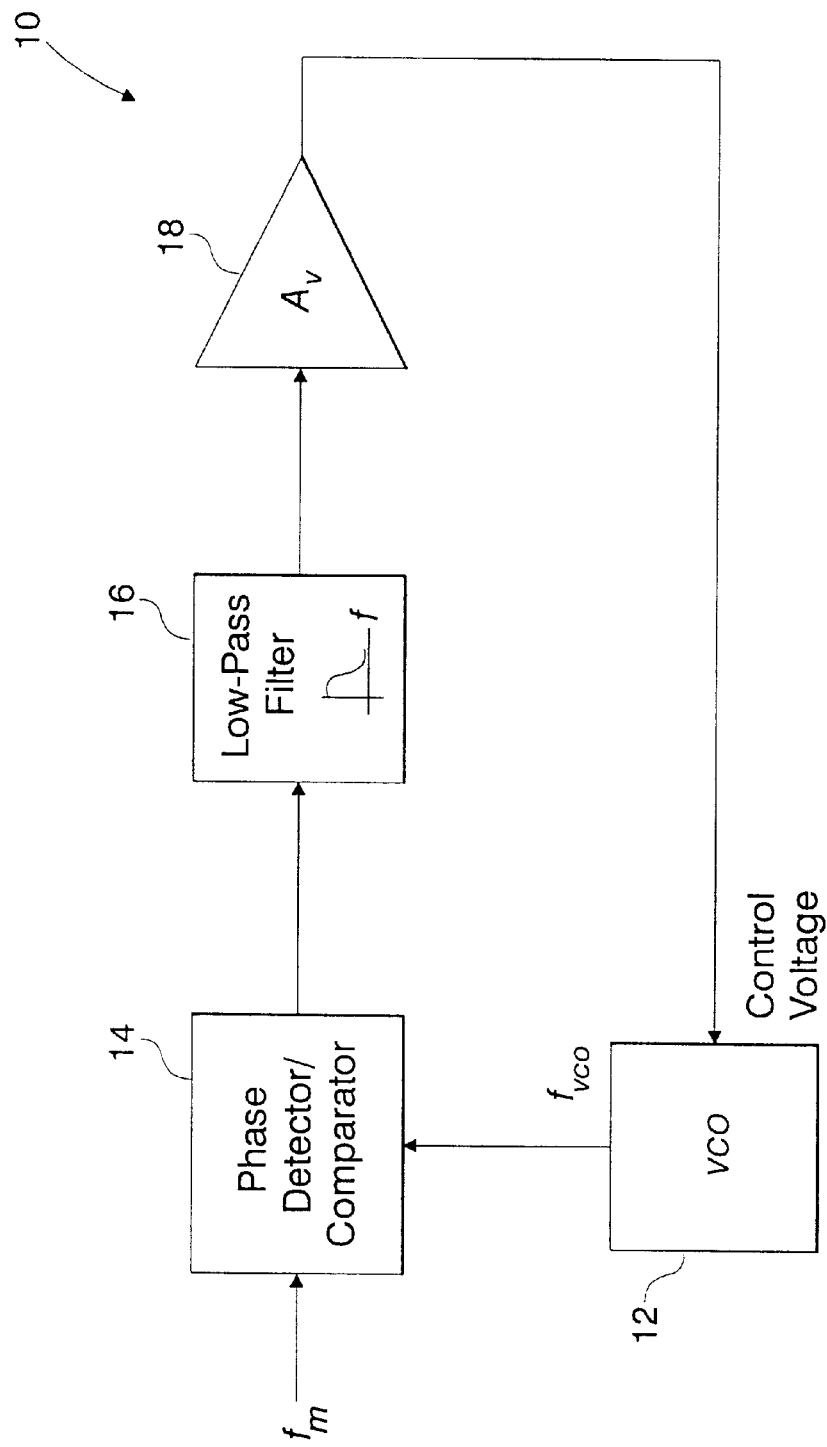
FIG. 1 is a functional block diagram of a conventional phase lock loop circuit.
Figure 2A:
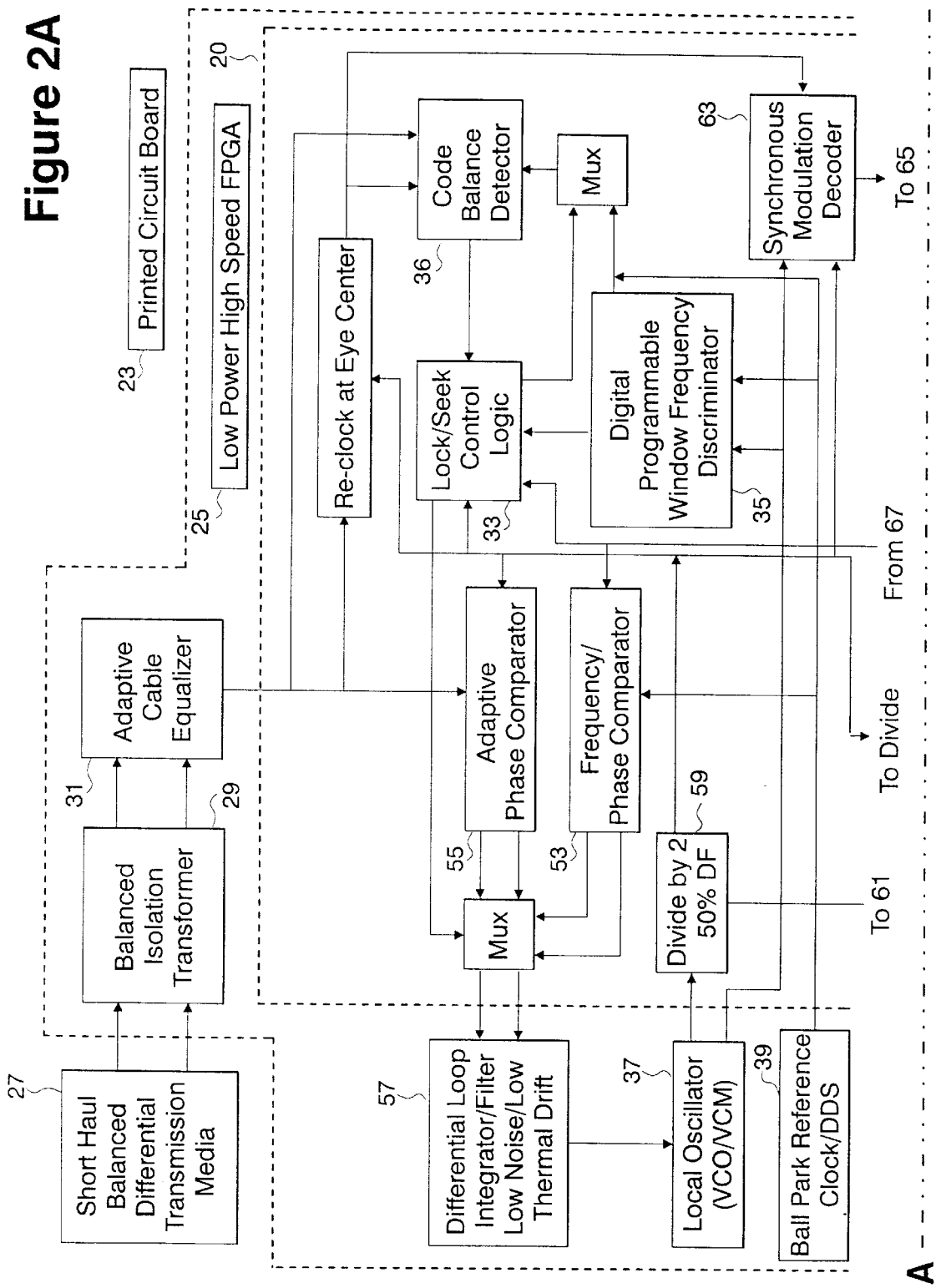
FIGS. 2A and 2B are a functional diagram of a low jitter phase lock loop circuit of the present invention.
Figure 2B:
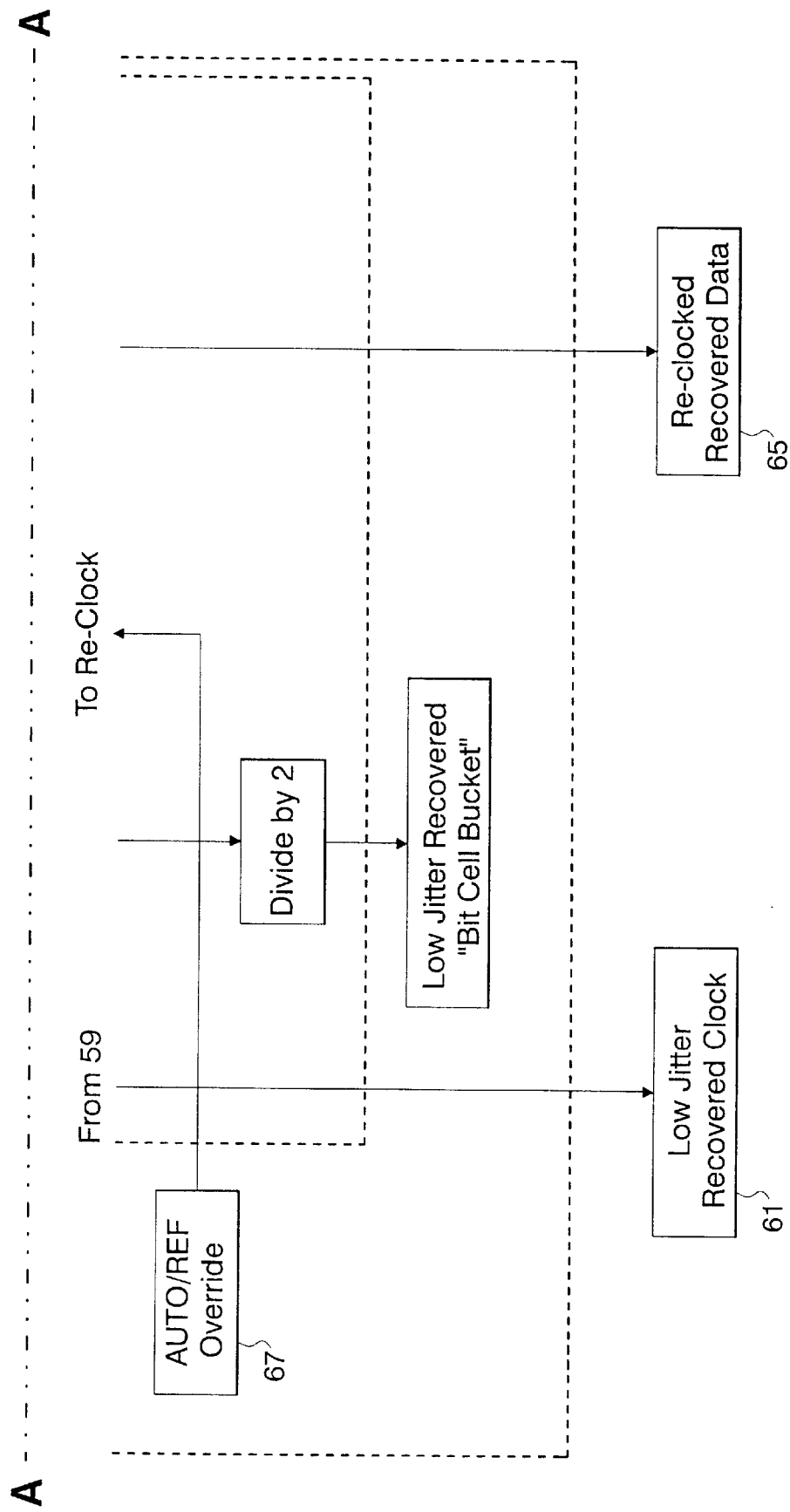

Now referring to the figures, wherein like elements are identically numbered, a functional block diagram of a phase lock loop ("PLL") circuit 20 of the present invention is shown in FIGS. 2A and 2B. PLL 20 and components in electrical communication therewith (further described hereinbelow) are supported by a printed circuit board (PCB) 23. The architecture for PLL 20 is similarly sustained on a field programmable gate array (FPGA) 25, that enables fast prototyping of circuits as is commonly known in the art.

At least one short haul transmission medium 27 furnishes a conduit for transfer of an incoming data stream from a transmitter source (not shown) to PLL 20. Transmission medium 27 is desirably selected from short haul cable lengths of coaxial and twisted pair cables, wires and the like desirably having a maximum length of about 320'. A balanced isolation transformer 29 is desirably coupled in electrical communication with transmission medium 27 for translating the incoming data stream onto PCB 23.

An adaptive cable equalizer 31 is provided that is coupled between balanced isolation transformer 29 and PLL 20 for reducing jitter inherent in the incoming data stream. Adaptive cable equalizer 31 allows short runs on inexpensive twisted wire pairs such as those found on fanouts to local devices. Adaptive cable equalizer 31 further adjusts for the lowest incoming jitter independent of cable length as a signal pre-conditioner to PLL 20, reducing system jitter thereby. Adaptive cable equalizer 31 may be selected from any of a plurality of commercially available embodiments that are well known in the art.

Figure 3A:
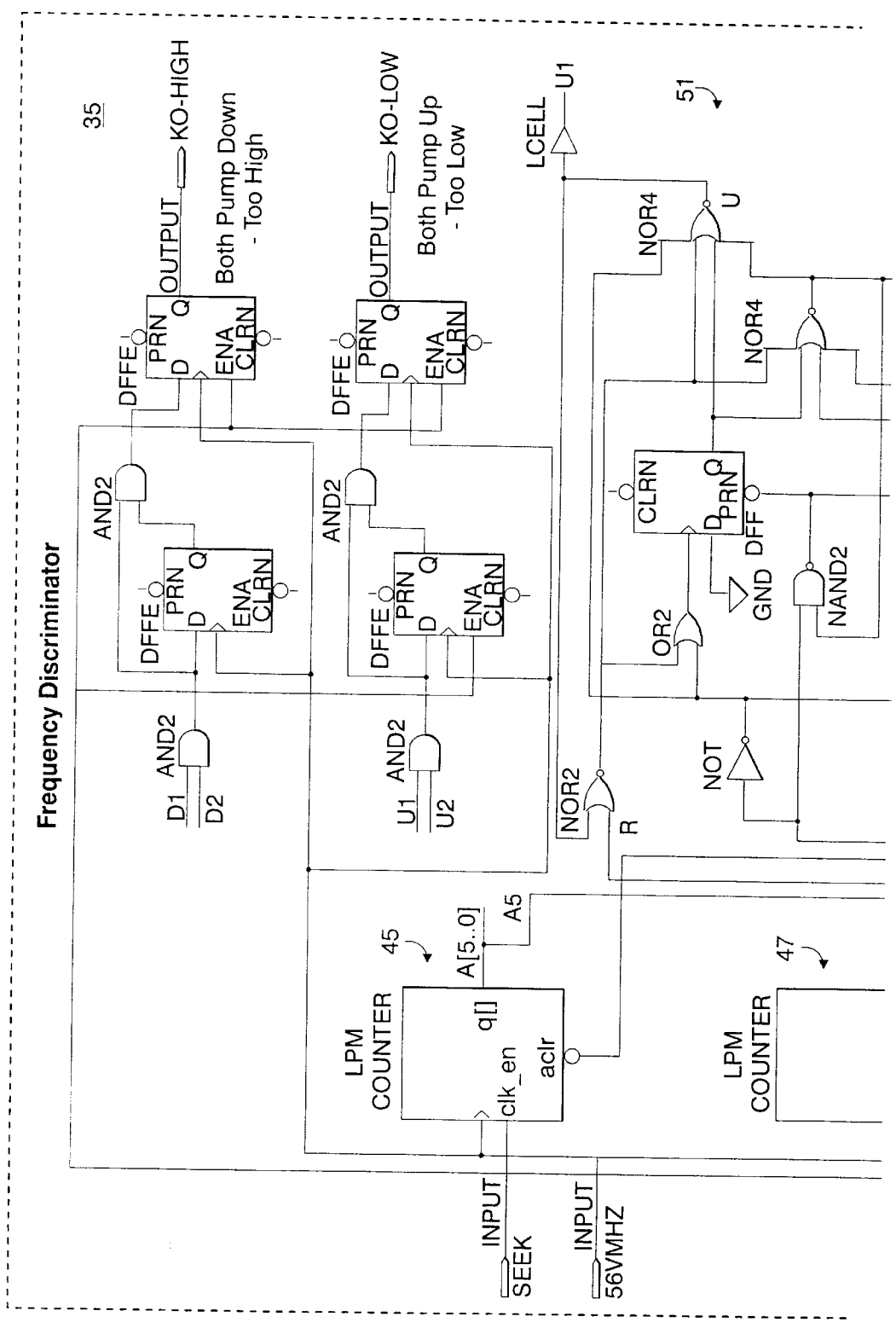
FIGS. 3A and 3B are a circuit diagram of a desired embodiment of a frequency discriminator used with a phase lock loop circuit of the present invention.
Figure 3B:
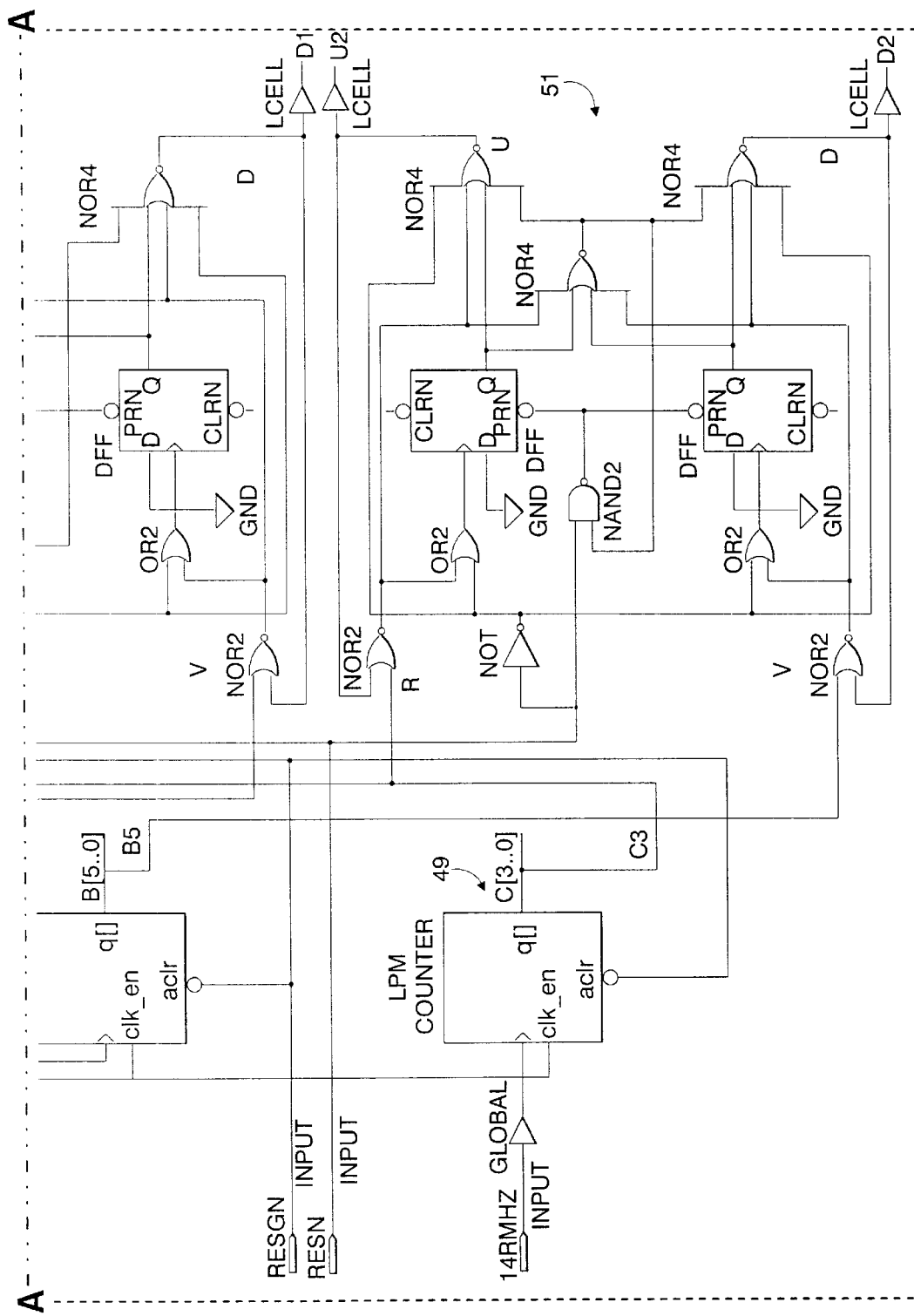

PLL 20 implements an "autoranging" technique that enables preprogramming of a discrete frequency window within which an incoming signal is identified to which lock is effected. Such autoranging capability is executed by a lock and seek control logic 33. Control logic 33 has a first input that is connected to an output of a digital programmable frequency discriminator 35 (further described hereinbelow) in electrical communication with a balance code detector circuit 36. Balance code detector fault is the first indication of a possible harmonic lockup but is not sufficient alone since the received data may contain errors. Frequency discriminator 35 verifies re-acquisition to enable precise programming of a wide frequency tracking range; this sets the window frequency frame within which a signal shall be "locked" to derive data from the data stream and further provide harmonic lockup protection over the prescribed range. An exemplary model of a frequency discriminator for use with the present invention is illustrated in FIG. 3 and further described hereinbelow.

Frequency discriminator 35 uses dividers and frequency-phase comparators to set an upper and lower window around a local clock signal generated by a local oscillator or clock 37. Frequency discriminator 35 produces an output voltage that depends on an instantaneous signal frequency generated in response to the local clock signal and an input reference signal generated by a reference clock 39. Its signal is also utilized as a feedback signal within the loop. Local oscillator 37 is shown in FIG. 2A as a VCO or VCM that is well established in the art as an electronically tunable oscillator in which the output frequency is dependent on the value of an applied tuning voltage. Improved jitter performance can be easily attained by the use of low phase noise differential signal VCOs. It is understood, however, that the type of tunable oscillator implemented with the present invention may be modified without departing from the scope thereof.

Further referring to FIG. 2A, reference clock 39 provides a baseline reference frequency to frequency discriminator 35 and is selected from an external fixed clock such as a crystal reference clock or an external dynamic clock such as a direct digitally synthesized (DDS) clock. Reference clock 39 eliminates any analog tuning components, thereby eliminating the drift and aging characteristics associated with such devices. A DDS reference input may be used to quickly acquire and track a known frequency/time profile within a narrow window while avoiding harmonics with low signal to noise ratio (S/N) inputs. Reference clock 39 therefore provides a "ball park" clock reference to frequency discriminator 35 and a basis for creating an exact frequency window using programmable counters. This window will not drift or vary with age as occurs with conventional control voltage threshold detectors.

Frequency discriminator 35 further uses programmable counters that can make the frequency window as small as needed to ensure that no harmonics with sufficient power to cause lock with the selected filter network will occur. As further shown in FIGS. 3A and 3B, an illustrative frequency discriminator 35' conducive to operation of the present invention PLL 20 is provided wherein frequency discriminator 35' includes an upper frequency threshold counter 45 and a lower frequency threshold counter 47 for establishing threshold settings around the local clock signal. Each of upper counter 45 and lower counter 47 divides the reference clock signal by a distinct predetermined divisor. Frequency discriminator 35' further includes a reference clock frequency counter 49 that divides the local clock signal by a predetermined divisor to generate a local reference clock signal.

Frequency discriminator 35' includes at least one frequency phase comparator 51 having an input from one of lower frequency threshold counter 45 and upper frequency threshold counter 47, and an input from reference clock frequency counter 49. Comparator 51 establishes at least one of a minimum frequency and a maximum frequency that will not cause reacquisition of the reference clock signal. In practice it may be necessary to inhibit the output of local oscillator 37 many times to determine if the window is narrow enough to avoid harmonics, however, the tracking range will be hard limited by this window.

Referring back to FIG. 2, a frequency/phase comparator 53 is provided in electrical communication with reference clock 39. Comparator 53 detects the phase difference between the reference frequency input and the signal frequency input from the VCO. Frequency/phase comparator 52 locks on to the input reference signal to effect the locking step.

An adaptive phase only comparator 55 is provided in electrical communication with lock and seek control logic 33 wherein phase only comparator 55 determines a phase difference between the input reference signal and the local clock signal when lock is effected therebetween. Phase comparator 55 then generates a phase error signal corresponding to this phase difference and in proportion to the period so as to adapt to changing input frequency and thereby reduce phase lead and/or lag over a wide frequency spectrum. Phase comparator 55 minimizes phase drift by varying output pulse width proportionally with frequency to accommodate a wide dynamic and swept frequency range with low phase error. The integration of phase comparator 55 therefore results in equal jitter specifications over the entire control voltage, translating to a full frequency range over a large frequency span.

A differential loop integrator or filter 57 is also provided in PLL 20 wherein filter 57 not only reduces frequency-dependent phase shift error, but also reduces temperature induced phase drift. Differential loop filter 57 is in electrical communication with each of adaptive phase comparator 55 and frequency/phase comparator 53. Differential loop filter 57 generates a voltage control signal that corresponds to the phase error signal generated by phase comparator 55 and delivers such control voltage signal to local oscillator 37. Upon achievement of said locking step, PLL 20 transmits this control voltage into the programmable range of frequency discriminator 35 so as to repeatedly lock the circuit to the input reference signal. Differential loop filter 57 lowers control voltage noise, increases sensitivity and dynamic range, increases frequency tracking range, increases common mode noise rejection, compensates for component variations and reduces thermal drift and jitter. Filter 57 thereby adapts to component variations so as to minimize the effects of thermally induced phase shift and noise.

PLL 20 further includes a divider 59 (shown herein as a divide-by-2 divider) in electrical communication with local oscillator 37 to provide a low jitter recovered clock 61 having 50% duty factor. PLL 20 additionally has a synchronous modulation decoder circuit 63 having inputs from local oscillator 39 and the data stream for demodulating re-clocked digital input data from the data stream and recovering the re-clocked data 65 therefrom. Demodulation of a signal takes place at a receiver located some distance from the transmitter. The process whereby demodulation is carried out by a second multiplication requires that the carrier available at the receiver be precisely synchronous with the carrier used in the modulation process. Synchronous modulation decoder circuit 63 may be selected from a plurality of modulation methods that are known within the art (i.e., this can be "IP" or other logic implemented in the FPGA, although any type conducive to operation of the present invention will suffice).

PLL 20 optionally includes a reference override 67 in electrical communication with lock and seek control logic 33. Reference override 67 will force the lock on the ball park reference 39 when no input signal is available.

PLL 20 may also include at least one indicator (not shown) for indicating when PLL 20 has not attained signal acquisition and lock. The indicator, which may be an LED indicator or the like, is desirably pulse-stretched so that intermittent problems can be readily visualized. The indicator can therefore illuminate when out of lock.

At the initiation of signal transmission, then, there are two frequencies applied to phase comparator 55. As the loop acquires lock, PLL 20 must deal with two different ranges: one in the area in which frequency lock is acquired and, only after frequency lock has been accomplished, one in which phase lock occurs. In operation, frequency/phase comparator 53 first establishes lock-in with reference clock 39. Once frequency/phase lock is established and the phase error is minimized as the control voltage stabilizes, phase comparator 55 switches in for phase encoded data separation. Phase comparator 55 determines the phase differences between the input signals and the local reference. The rising edge of local oscillator clock 37 is measured against the pseudo-random code generator crystal output as a trigger to make jitter measurements. The detected phase error signal is filtered so as to reduce noise and is sent thereafter to local oscillator 37. Oscillator 37 adjusts the frequency of the locally generated signal accordingly to approach lock.

A "ball park" frequency is selected by producing a digital clock frequency that will center the window established by frequency discriminator 35. Frequency lock must be established first, then phase lock. Frequency discriminator 35 will therefore force frequency comparator 53 to be used, and when this locks, phase comparator 55 can be used. Thus, when stable lock is attained, lock and seek control logic 33 switches over to adaptive phase comparator 55, a frequency compensated phase detector for swept frequency systems. Since filter 57 will not allow a step response when switching away from reference clock 39 over to the input signal, the output of filter 57 is initially within the ball park VCO control voltage to achieve the desired frequency for any given set of initial conditions, even with component variations from unit to unit. PLL 20 then, upon frequency lock, confines the rather arbitrary control voltage now to the ball park frequency. Only a small adjustment to the control voltage now will lock the output of filer 57 to the desired frequency every time. In this configuration, frequency/phase detector 53 determines initial point frequency so that no tuning is necessary even with component variations between filter 57 and local oscillator 37. In this manner, hard limits can be precisely set without deleterious effects from component aging or variation as is found with analog frequency comparators.

Lock and seek logic 33 will automatically attempt to re-acquire if no lock is detected after a programmable frequency dependent input delay. Logic 33 will then return to locking on the reference frequency and the cycle repeats itself. If the input signal does not get kicked out by frequency discriminator 35, then an accurate and harmonic-free lock has been achieved. A pulse stretched indicator as described hereinabove desirably indicates successful phase lock on the input signal.

Frequency discriminator 35, in combination with PLL 20, can restrict operation to a precise frequency range having its accuracy determined solely by the high accuracy of reference clock 39. This can be useful in deciphering frequency division multiplexed signals over transmission media without the need for preambles. Discriminator 35 may alternatively be used to hold or constrain the output frequency of local oscillator 37 when a signal is lost or interrupted. In fixed or periodic swept frequency systems, a fixed frequency reference may be used to quickly and accurately set the initial local oscillator control voltage for fast signal acquisition, and to establish a programmable and precise fixed frequency tracking window. A narrow window can be established for fixed frequency or a wider window established for swept frequency inputs.

The control signals generated by phase comparator 55 are proportional to the input signal period to keep phase offset minimized. Phase comparator 55 therefore allows a very wide range of input frequencies as the period is divided in half before the control voltage outputs are produced. This reduces and nearly eliminates phase shift for swept frequency systems, such as those that are commonly found in high velocity systems (i.e., missile, aircraft and satellite systems, as well as particle accelerators). Precise timing applications for these systems require low jitter and precise aperture windowing.

An illustrative example of the operation of the present inventive PLL is provided in the example below. It is emphasized that the values provided herein merely constitute an example of the efficiency with which the present process can be completed, and that these values can be affected as described thoroughly hereinabove. It is therefore understood that any or all steps may be modified in sequence or duration to adapt to different applications.

Example

Frequency discriminator window threshold settings:

*The upper frequency (UF) threshold counter is set to divide a recovered 2X reference clock=56 MHz by 52

*The lower frequency (LF) threshold counter is set to divide a recovered 2X reference clock=56 MHz by 60

*The crystal reference clock=14.318 MHz is divided by 14.

56 MHz/52=1.08 MHZ (high threshold)

56 MHZ/60=0.938 MHz (low threshold)

14.318 MHz/14=1.023 MHz (reference).

When the reference is between the high and low thresholds (0.938 MHz<=1.023 MHz<=MHz <=1.08 MHz), the frequency discriminator will not attempt to reacquire the signal.

Using the above settings with a 14.318 reference crystal clock oscillator:

1.) The minimum frequency that will not cause reacquisition is:

LF/52=1.023 MHz thus LF=53.196 MHz (low threshold)

2.) The maximum frequency that will not cause re-acquisition is:

HF/60=1.023 thus HF=61.38 MHz (high threshold)

The following stable harmonics have been identified using a 14.318 MHz reference oscillator with a desired 57.272 MHz fundamental PLL frequency using the phase only comparator:

| MHz | Harmonic Ratio | Decimal |
| --- | --- | --- |
| 32.7274 | 4/7 | 0.571428 |
| 34.3637 | 6/10 | 0.6 |
| 38.1819 | 2/3 | 0.666666 |
| 40.0910 | 7/10 | 0.7 |
| 40.9092 | 5/7 | 0.714285 |
| 42.9547 | 3/4 | 0.75 |
| 45.8183 | 8/10 | 0.8 |
| 47.7274 | 5/6 | 0.833333 |

Other integer ratio harmonics are possible, but these lacked sufficient power to cause a harmonic lock in the test set over the tracking range (28 MHz through 80 MHz). For example, the 7/9 harmonic did not occur. The frequency discriminator prevents these harmonics.

Using the same ratios for the 2X reference clock at +0%, −0.3% for an approximately 56 MHz operation, the following possible harmonics were predicted using the same harmonic ratios as above.

| −0.3% (MHz) | 0% (MHz) | Harmonic Ratio |
| --- | --- | --- |
| 32.07 | 32.17 | 4/7 |
| 33.68 | 33.78 | 6/10 |
| 37.42 | 37.53 | 2/3 |
| 39.29 | 39.41 | 7/10 |
| 40.09 | 40.21 | 5/7 |
| 42.10 | 42.23 | 3/4 |
| 44.90 | 45.04 | 8/10 |
| 46.78 | 46.92 | 5/6 |

The ±5% discriminator threshold at 53.196 MHz is well above the next nearest stable harmonic (5/6).

Testing reveals lock-up without harmonic lock every time, illustrating the predictability and repeatability of PLL 20 performance. Such predictable operation is important in guaranteeing that a plurality of PLLs will all achieve lock in critical systems, as there is no practical way to "bump" any PLL that does not gain harmonic-free lock-up on encoded data in a broadcast system. Each PLL unit must achieve lock the first time without any re-tries when signal cables are attached to a running system and without preambles. This allows clock and data to be sent on a single transmission medium without compromising jitter performance. The advantages are large when compared to dual media systems, as small thermal shifts will change the phase of the clock of the data, not only resulting in irretrievable data loss but also requiring precise media length matching and thermal compensation.

In addition, the temperature performance of PLL 20 is excellent due to the implementation of differential filter 57 in combination therewith. Filter 57 resolves to nanovolt control voltages for picosecond resolution and precision in phase. This frequency sweep range performance goes well beyond that of VCOs commonly used to recover data in high bit rate (i.e. fixed frequency) communications systems. PLL 20 thereby separates clock from data such that the recovered clock and data are reduced significantly in jitter. This is very beneficial for accurate position control systems.

In the present embodiment, PLL 20 has a desirable jitter of about 50 ps, a maximum RMS jitter of 125 ps and a maximum peak-peak jitter of 1 ns when used in lengthy cable distribution systems with swept frequency inputs and phase modulated data. It can be used in numerous applications with data rates ranging from a few Hz to several GHz. For simple clock multiplication applications, the jitter is better than 25 ps RMS in the 10 to 50 MHz range. These ranges, however, are not hard limited by the scope of this disclosure and merely serve as an illustration of the jitter attenuation that is attainable by the inventive circuit topology.

The PLL of the present invention therefore exhibits differential locking capability over a larger range of frequencies than those attainable by conventional PLLs. The present invention PLL works on the data stream itself, exhibiting an "autoranging" capability wherein the PLL locks onto different frequencies without harmonic lockup. This technology could be used to advance transmission electron microscope images, MRI equipment, telescopes, electronic lenses, filters, any instrument that accepts wavelength information and it is desired to stabilize the image of that wavelength under varying input conditions. The result is a sharper image and more precise positions for fixed or moving point targets.

The PLL disclosed herein, especially in combination with an adaptive cable equalizer, can solve many imaging, transmission and position measurement problems involving noise-limited precision due to transmission media property shifts. Consequently, it is also possible to stabilize the image of rapidly moving targets with PLL 20. Implementation of the present invention is advantageous in a myriad of applications, which includes but is not limited to those applications requiring precise space and time measurement (i.e., telemetry, trajectory, radar, Doppler radar, phased array radar and guidance systems; global positioning satellite equipment, satellite communications equipment, survey equipment, HDTV and other precise positioning or measuring equipment). The present invention is also desirable for picosecond-adjustable passive fiber optic delays: high baud rate receivers: range and velocity finding or trajectory measurement equipment; gyroscopes; precise high speed rotation measurement and control such as is used in scanners, printers, scanning image surveillance satellites, or attitude correction electronics; communications systems; and systems with large inertial damping requirements. The above described combination of features consistently yields incrementally better results relative to conventional PLL circuits. Most PLL systems are designed to operate over a relatively narrow frequency range, and preambles are commonly used to prevent harmonic locks. The present invention PLL is performance oriented and many of its enhancements are performance related with its large swept frequency range and large frequency span. The PLL design disclosed herein can therefore "seek" over encoded data harmonics without lock-up on those harmonics during signal acquisition. This design requires no preamble to attain its harmonic-free lock performance.

Swept systems require a large tracking range that may pass through several harmonics of the source signal. This design provides all of the necessary detection circuitry to prevent any harmonic lockups upon signal acquisition with encoded data without any false locks due to power up or signal interruption. This design has no analog comparator that could drift with temperature and range The signal information processing techniques achieved by the present invention PLL can further produce a new level of clarity or certainty at many points in space at the same time if the distributed signal aperture is adequately stabilized in time to picoseconds or better. These techniques can pass data along with the signal such that many distributed devices can share the same broadcast information. With loopback techniques, the timing can be equalized over great distances through a noisy transmission media that may experience variations due to temperature, Doppler effect or physically curved trajectories. The resultant signal can be automatically trimmed to noise floor accuracy, in both resolution and precision.

Various changes to the foregoing described and shown methods and corresponding structures would now be evident to those skilled in the art. The matter set forth in the foregoing description and accompanying figures is therefore offered by way of illustration only and not as a limitation. Accordingly, the particularly disclosed scope of the invention is set forth in the following claims.

What is claimed is:

1. A wide tracking range phase lock loop (PLL) circuit, comprising:
   a lock and seek control logic that provides a programmable window frequency discriminator for presetting a frequency window of upper and lower frequency limits to derive a programmable range within which a signal is locked to derive data from an incoming data stream and a balanced code detector circuit in electrical communication with said discriminator for harmonic elimination in said data stream.

2. The PLL circuit of claim 1 further including a reference clock for providing an input reference signal to said frequency discriminator.

3. The PLL circuit of claim 2 wherein said reference clock is selected from an external fixed clock and an external dynamic clock.

4. The PLL circuit of claim 3 wherein said external fixed clock is a crystal reference clock.

5. The PLL circuit of claim 3 wherein said external dynamic clock is a direct digitally synthesized clock.

6. The PLL circuit of claim 2 further including a local oscillator for generating a local clock signal wherein said local clock signal is also utilized as a feedback signal.

7. The PLL circuit of claim 6 wherein said local oscillator is selected from a voltage controlled oscillator, a voltage controlled crystal oscillator and a voltage controlled multivibrator.

8. The PLL circuit of claim 6 further including a divide-by-2 divider in electrical communication with said local oscillator to provide a low jitter recovered clock having 50% duty factor.

9. The PLL circuit of claim 6 further including a synchronous modulation decoder circuit having inputs from said local oscillator and said data stream for demodulating re-clocked digital input data from said data stream and recovering said re-clocked data therefrom.

10. The PLL circuit of claim 6 wherein said frequency discriminator includes an upper frequency threshold counter and a lower frequency threshold counter for establishing threshold settings around said local clock signal, wherein each of said upper and lower frequency threshold counters divide a recovered reference clock signal by a distinct predetermined divisor.

11. The PLL circuit of claim 10 wherein said frequency discriminator further includes a reference clock frequency counter that divides said local clock signal by a predetermined divisor to generate a reference clock signal.

12. The PLL circuit of claim 11 wherein said frequency discriminator includes at least one frequency phase comparator having an input from one of said lower frequency threshold counter and said upper frequency threshold counter, and an input from said reference clock frequency counter, said comparator establishing at least one of a minimum frequency and a maximum frequency that will not cause reacquisition of said reference clock signal.

13. The PLL circuit of claim 6 further including a frequency/phase comparator in electrical communication with said reference clock to establish a lock with said input reference signal.

14. The PLL circuit of claim 13 further including an adaptive phase only comparator in electrical communication with said lock and seek control logic wherein said phase only comparator determines a phase difference between said input reference signal and said local clock signal when lock is effected therebetween and generates a phase error signal corresponding to said phase difference.

15. The PLL circuit of claim 14 further including a differential loop filter in electrical communication with said adaptive phase comparator and said frequency/phase comparator that generates a voltage control signal that is output to said local oscillator, wherein said voltage control signal corresponds to said phase error signal.

16. The PLL circuit of claim 15 wherein said differential loop filter sends said voltage control signal to said local oscillator.

17. The PLL circuit of claim 15 further including a short haul transmission medium that provides a conduit for transfer of said incoming data stream from a transmitter source to said PLL circuit.

18. The PLL circuit of claim 17 wherein said short haul transmission medium is selected from short haul cable lengths of coaxial and twisted pair cables and wires.

19. The PLL circuit of claim 17 wherein said short haul transmission medium has a maximum length of about 320'.

20. The PLL circuit of claim 17 further including a balanced isolation transformer coupled with said short haul transmission medium for translating said incoming data stream from said short haul transmission medium onto a printed circuit board supporting said PLL circuit thereon.

21. The PLL circuit of claim 20 further including an adaptive cable equalizer coupled between said balanced isolation transformer and said PLL circuit for reducing jitter inherent in said data stream.

22. The PLL circuit of claim 1 further including a reference override in electrical communication with said lock and seek control logic that allows said PLL circuit to use a stable reference when said input reference signal is absent.

23. The PLL circuit of claim 1 further including at least one indicator for indicating when said PLL circuit has not attained signal acquisition and lock.

24. A method of automatically seeking and locking on to fixed and varying frequency encoded signals in an incoming serial data stream and rejecting harmonics thereof, said method comprising the steps of:
   providing a wide tracking range phase lock loop (PLL) circuit, comprising:

a lock and seek control logic that provides a programmable window frequency discriminator for presetting a frequency window of upper and lower frequency limits to derive a programmable range within which a signal is locked to derive data from an incoming data stream and a balance code detector circuit in electrical communication with said discriminator to verify re-acquisition;

providing each of an input reference signal and an initial control voltage to said circuit; and locking said control voltage to said input reference signal;

whereupon achievement of said locking step, said circuit places said control voltage into said programmable range so as to repeatedly lock said circuit to said input reference signal.

25. The method of claim 24 further including the step of providing a reference clock for generating said input reference signal.

26. The method of claim 25 wherein said reference clock is selected from an external fixed clock and an external dynamic clock.

27. The method of claim 26 wherein said external fixed clock is a crystal reference clock.

28. The method of claim 26 wherein said external dynamic clock is a direct digitally synthesized clock.

29. The method of claim 24 further including the step of providing a local oscillator for generating said control voltage as a local clock signal.

30. The method of claim 29 wherein said local oscillator is selected from a voltage controlled oscillator, a voltage controlled crystal oscillator and a voltage controlled multivibrator.

31. The method of claim 29 further including the step of providing a divide-by-2 divider in electrical communication with said local oscillator to provide a low jitter recovered clock having 50% duty factor.

32. The method of claim 29 further including the step of providing a synchronous modulation decoder circuit having inputs from said local oscillator and said data stream for demodulating re-clocked digital input data from said data stream and recovering said re-clocked data therefrom.

33. The method of claim 29 wherein said frequency discriminator includes an upper frequency threshold counter and a lower frequency threshold counter for establishing threshold settings around said local clock signal, wherein each of said upper and lower frequency threshold counters divide said input reference signal by a distinct predetermined divisor.

34. The method of claim 33 wherein said frequency discriminator further includes a reference clock frequency counter that divides said local clock signal by a predetermined divisor to generate a reference clock signal.

35. The method of claim 34 wherein said frequency discriminator includes at least one frequency phase comparator having an input from one of said lower frequency threshold counter and said upper frequency threshold counter, and an input from said reference clock frequency counter, said comparator establishing a least one of a minimum frequency and a maximum frequency that will not cause reacquisition of said reference clock signal.

36. The method of claim 29 further including the step of providing a frequency/phase comparator in electrical communication with said reference clock wherein said frequency/phase comparator locks on to said input reference signal to effect said locking step.

37. The method of claim 36 further including the step of providing an adaptive phase only comparator in electrical communication with said lock and seek control logic wherein said phase only comparator determines a phase difference between said input reference signal and said local clock signal when said locking step is effected.

38. The method of claim 37 wherein said phase only comparator generates a phase error signal representative of said phase difference between said input reference signal and said local clock signal.

39. The method of claim 38 further including the step of providing a differential loop filter in electrical communication with said adaptive phase comparator and said frequency/phase comparator that generates a voltage control signal that is output to said local oscillator, wherein said voltage control signal corresponds to said phase error signal.

40. The method of claim 39 wherein said differential loop filter sends said control signal to said local oscillator.

41. The method of claim 39 further including the step of providing a short haul transmission medium that provides a conduit for transfer of said incoming data stream from a transmitter source to said PLL circuit.

42. The method of claim 41 wherein said short haul transmission medium is selected from short haul cable lengths of coaxial and twisted pair cables and wires.

43. The method of claim 41 further including the step of coupling a balanced isolation transformer with said short haul transmission medium for translating said incoming data stream from said short haul transmission medium onto a printed circuit board supporting said PLL circuit thereon.

44. The method of claim 43 further including the step of coupling an adaptive cable equalizer between said balanced isolation transformer and said PLL circuit for reducing jitter inherent in said data stream.

45. The method of claim 24 further including the step of providing a reference override in electrical communication with said lock and seek control logic that allows said PLL circuit to use a stable reference when said input reference signal is absent.

46. The method of claim 24 wherein said circuit attempts to re-acquire said incoming data stream if said locking step is not effected after a predetermined frequency-dependent input delay.

47. The method of claim 24 further including the step of providing at least one indicator to indicate when said PLL circuit has effected said locking step.

* * * * *